(12) United States Patent
Gonzales et al.

(10) Patent No.: US 9,729,138 B1
(45) Date of Patent: Aug. 8, 2017

(54) CIRCUITS AND SYSTEMS HAVING LOW POWER POWER-ON-RESET AND/OR BROWN OUT DETECTION

(71) Applicant: Adesto Technologies Corporation, Sunnyvale, CA (US)

(72) Inventors: Nathan Gonzales, San Jose, CA (US); John Dinh, Dublin, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/085,904

(22) Filed: Mar. 30, 2016

Related U.S. Application Data

(60) Provisional application No. 62/268,459, filed on Dec. 16, 2015.

(51) Int. Cl.
  *G06F 1/24* (2006.01)
  *H03K 17/22* (2006.01)

(52) U.S. Cl.
  CPC ............ *H03K 17/223* (2013.01); *G06F 1/24* (2013.01)

(58) Field of Classification Search
  CPC .. G06F 1/24; G06F 1/26; H03K 17/22; H03K 17/223
  USPC ......................................... 327/142, 143, 182
  See application file for complete search history.

(56) References Cited

U.S. PATENT DOCUMENTS

| 6,084,446 | A | * | 7/2000 | Chen | H03K 3/356008 |
| | | | | | 327/143 |
| 6,281,723 | B1 | * | 8/2001 | Tailliet | H03K 19/1735 |
| | | | | | 327/143 |
| 6,897,689 | B2 | | 5/2005 | La Rosa | |
| 8,344,767 | B2 | | 1/2013 | Li et al. | |
| 8,605,536 | B2 | | 12/2013 | Terzioglu et al. | |
| 8,766,679 | B1 | | 7/2014 | Paek et al. | |
| 8,803,580 | B2 | | 8/2014 | Shi et al. | |
| 2007/0103210 | A1 | * | 5/2007 | Hsu | H03K 17/223 |
| | | | | | 327/143 |
| 2014/0077842 | A1 | * | 3/2014 | Zhang | G06F 1/30 |
| | | | | | 327/72 |
| 2016/0105169 | A1 | * | 4/2016 | Lou | H03K 17/223 |
| | | | | | 327/143 |

\* cited by examiner

*Primary Examiner* — William Hernandez

(57) ABSTRACT

A circuit can include a signal section that includes a first signal transistor configured to operate in a subthreshold region to maintain the signal node at about VCC as VCC rises from a low level; a high threshold section that enables a current path from the signal node to the low power supply node only after a voltage at the detect node exceeds a level greater than a threshold voltage (Vt); and an output section having transistors with relatively long channels, for reduced crowbar current.

20 Claims, 7 Drawing Sheets

(BACKGROUND)

US 9,729,138 B1

CIRCUITS AND SYSTEMS HAVING LOW POWER POWER-ON-RESET AND/OR BROWN OUT DETECTION

This application claims the benefit of U.S. provisional patent application Ser. No. 62/268,459, filed on Dec. 16, 2015, the contents of which are incorporated by reference herein.

TECHNICAL FIELD

The present disclosure relates generally to circuits that generate signals in response to power supply levels, and more particularly to power-on reset circuits that can generate a reset signal in response to a power supply voltage rising from a low level to a high level.

BACKGROUND

Integrated circuit (IC) devices can typically include power-on reset (POR) circuits. Conventional POR circuits generate a pulse as a power supply voltage rises from a low level to a high level (i.e., ramps-up). Such a pulse can be used to signal that a power supply voltage for a device (e.g., integrated circuit) is sufficiently high enough to begin initializing other circuits or applying power to other circuits in order to start standard operations.

In addition to POR circuits, which can detect power-on/reset events, devices can also include "brown-out" detection (BOD) circuits. BOD circuits can detect brown-out conditions of a device. A brown-out condition can occur when a high power supply voltage falls below a predetermined level (i.e., a level at which a device may no longer operate as desired, or cannot be guaranteed to operate as desired).

FIG. 9 is a block schematic diagram of a conventional POR circuit 901. POR circuit 901 can include a voltage sense section 903, and series connected inverters 905-0/1/2. Voltage sense section 903 can include a capacitance C91, a discharge path M91, and a resistance R91. Capacitance C91 can be connected between a node A and a low power supply voltage (VSS). Discharge path M91 can be a transistor having a source connected to a high power supply voltage VCC, and a gate and drain connected to node A. Resistance R91 can be connected between VCC and node A. Inverter 905-0 has an input connected to node A, and an output (node B). Inverters 905-1/2 are arranged in series with inverter 905-0 and provide outputs shown as node B and a RESET signal, respectively.

During a fast ramping of VCC, node A can rise, but at a rate delayed with respect to VCC. As a result, inverters 905-0 to -2 can initially drive RESET signal high, starting a POR pulse. Once node A rises higher than a threshold voltage of inverter 905-0, inverters 905-0 to -2 can drive RESET signal low, ending a POR pulse.

However, during a slower ramping of VCC, there may not be sufficient delay between node A and VCC, and as a result, conventional POR circuit 901 may not generate a pulse. This can be remedied by increasing a size of resistance R91 and capacitance C91, but such a solution can require undesirably large amounts of circuit area and so be impractical for some designs.

DETAILED DESCRIPTION

Figure 1:
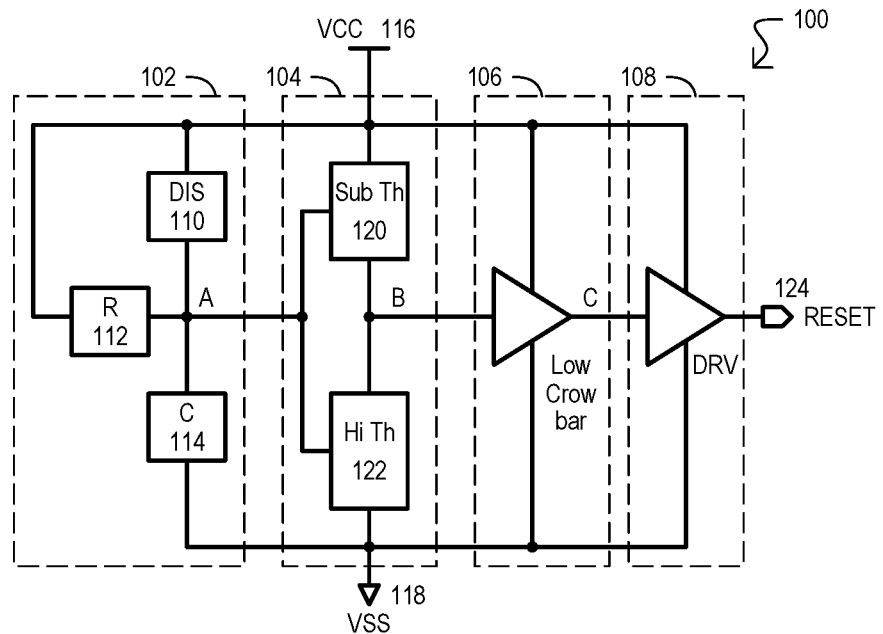
FIG. 1 is a block schematic diagram of a power-on reset (POR) circuit according to an embodiment.

According to embodiments, devices and methods can utilize a power-on reset (POR) type circuit that includes a signal stage with a signal transistor that operates in the subthreshold region to start a POR pulse by charging a signal node according to the power supply voltage. The circuit can also include a detect section that can sense a delayed rise in the power supply voltage, to thereby signal the termination of the power-on reset (POR) pulse.

In some embodiments, the signal transistor (which can operate in the subthreshold region on power-up) can have a relatively short channel, for a high drive strength.

In some embodiments, a POR circuit can include an output stage that receives the signal node as an input. The output stage can include one or more drive transistors with long channels to reduce any crowbar current as the signal node transitions between a charged state and a discharged state.

In some embodiments, a POR circuit can also include a high threshold switching stage. A high threshold stage can drive the signal node low, terminating the POR pulse, only after a detect node in the detect section rises to a level higher than a threshold voltage of transistors included in the POR circuit.

In some embodiments, a POR circuit can further include a drive stage that drives a signal provided by the output stage.

In the various embodiments described, like items are referred to with the same reference characters but with the leading digits corresponding to the figure number.

FIG. 1 is a block schematic diagram of a POR circuit 100 according to an embodiment. A POR circuit 100 can be connected to a high power supply voltage node 116 that receives a high power supply voltage (VCC), and a low power supply voltage node 118 that receives a low power supply voltage (VSS). VCC can rise from a low level to a high level in response predetermined events, including but not limited to power-on and/or reset. VSS can be ground in some embodiments. It is understood that the term VCC as utilized for a high power supply voltage is not intended to be limited to any particular technology or architecture. For example, a high power supply is understood to include supply voltages referred to as VDD, Vhigh, etc.

A POR circuit 100 can generate a signal RESET, which can indicate a predetermined event (e.g., power-on or reset). In some embodiments, a RESET signal can be a pulse. Further, in particular embodiments, a RESET signal can also be a brown-out detection (BOD) signal, indicating when VCC falls below some predetermined minimum level. As noted above, a brown-out condition can indicate when a power supply voltage has fallen too low.

Referring still to FIG. 1, a detect section 102 can include a discharge circuit 110, a resistance 112, and a capacitance 114. A detect section 102 can provide a detect voltage at a node A which rises as a power supply voltage VCC rises, but is delayed in time according to the RC network formed by resistance 112 and capacitance 114. A discharge circuit 110 can discharge node A to high power supply node 116 in the event a voltage across capacitance 114 exceeds VCC by a predetermined amount.

A signal section 104 can include a sub-threshold circuit 120 and a high threshold circuit 122. A sub-threshold circuit 120 can include one or more transistors that can operate in the sub-threshold region when VCC ramps up, thus allowing node B to rise with VCC. In some embodiments, driving node B in this way can initiate a POR pulse. In some embodiments, sub-threshold circuit 120 can operate for power supply ramp rates that are relatively slow.

A high threshold circuit 122 can discharge node B when a voltage at node A exceeds a voltage limit. A threshold circuit 122 can include one or more transistors, and the voltage limit can be greater than a threshold voltage (Vt) of such transistors (assuming VSS is zero). In very particular embodiments, a threshold circuit 122 can include n-channel transistors, and the voltage limit can be no less than 2*Vt. Having such a higher threshold limit, as compared to just Vt, can help increase a pulse duration of a RESET signal, as VCC will have to charge capacitance 114 (node A) to the higher limit before the RESET pulse is terminated.

An output section 106 can drive can drive a node C according to a signal at node B. An output section 106 can be designed to draw a low "crowbar" current. A crowbar current can be a current drawn by series connected pull-up and pull-down devices that switch on and off to drive node C between VCC and VSS (e.g., a p-channel transistor and n-channel transistor in a CMOS type inverter) in response to a voltage at Node B. In particular embodiments, an output section 106 can utilize one or more long channel transistors to reduce crowbar current. An output section 106 may or may not invert a signal level at input node B to create an output signal at node C.

A drive section 108 can drive can a reset signal node 124 according to a signal at node C. A drive section 108 can include pull-up and pull-down devices of sufficient size to drive a load presented at node 124 to generate a desired RESET signal response.

Referring still to FIG. 1, operations of POR circuit 100 will now be described. In some operations, such as a power-on or reset operation, a voltage VCC may start low (e.g., VSS) and rise toward a maximum level.

As VCC initially rises, a voltage at node A can rise, based on resistance/capacitance 112/114. Initially, a voltage at node A can be too low to turn on high threshold circuit 122. At the same time, sub-threshold circuit 120 can enable node B to rise with VCC. This value can propagate through sections 106 and 108 to start a RESET pulse.

As VCC continues to rise, a voltage at node A can also rise. However, because high threshold circuit 122 requires a relatively high threshold voltage, node B can remain (relatively) high, and a RESET pulse can continue.

When a voltage at node A exceeds the high threshold required by high threshold circuit 122, high threshold circuit 122 can discharge node B to VSS. Output section 106 can switch drive node C to an opposite level (i.e., high to low or low to high), and any crowbar current generated by such switching can be reduced over conventional output stages, as noted above. Drive section 108 can drive node 124 according to the changes at node C to terminate a RESET pulse.

In this way, a RESET pulse can be generated in response to the ramping of a supply voltage VCC.

While a POR circuit 100 can generate a RESET pulse reflective of a ramping up of a power supply voltage, a POR circuit 100 can also serve as a brown out detection (BOD) circuit, activating a RESET signal when VCC drops too low. One particular brown-out detection operation will now be described.

When VCC is at a high level, node A can be charged, high threshold circuit 122 can be turned on, driving node B low, while sub-threshold circuit 120 can be turned off. In response to the low value at node B, output section 106 and drive section 108 can place the RESET signal at an inactive level.

As VCC drops, once a difference between node A and VCC exceeds a discharge threshold of discharge circuit 110, node A can discharge to VCC.

As VCC falls, node A can continue to fall. As a result, high threshold circuit 122 can turn off and sub-threshold section 120 can start to charge node B toward VCC. Output section 106 and drive section 108 can drive node 124 accordingly, placing RESET signal at an active level, indicating the brown out condition.

If VCC continues to be low, the RESET signal can continue to be active. However, if VCC begins to rise, it can start charging node A, until high threshold circuit 122 turns on, returning the RESET signal to the inactive state (and indicating the brown out condition is over).

Figure 2:
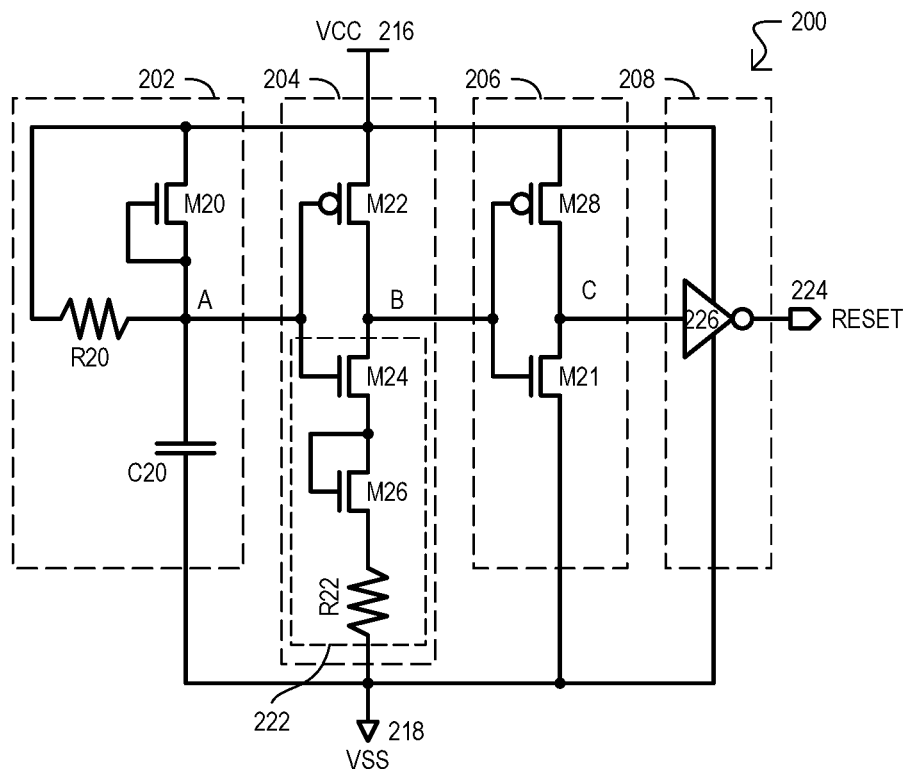
FIG. 2 is a block schematic diagram of a POR circuit according to another embodiment.

FIG. 2 is a block schematic diagram of a POR circuit 200 according to another embodiment. A POR circuit 200 can include sections like those of FIG. 1. In one embodiments, a POR circuit 200 can be one particular implementation of that shown in FIG. 1.

In the POR circuit 200 shown, a detect section 202 can include resistance R20 and capacitance C20. A discharge circuit can be a diode-connected n-channel transistor M20 (i.e., gate connected to drain), having a source connected to a high power supply node 216 and a gate and drain connected to node A. However, a discharge circuit can take any suitable form, including but not limited to a diode-connected p-channel transistor or a diode (e.g., p-n junction type diode), as but two examples.

Within a signal section 204, a sub-threshold circuit can include a p-channel signal transistor M22 having a source connected to a high power supply node 216, a drain connected to node B, and a gate connected to node A. In some embodiments, signal transistor M22 can be a short channel transistor, as compared to other p-channel transistors of the circuit 200. Further, when VCC initially ramps up, signal transistor M22 can operate in the sub-threshold region, to charge node B.

A high threshold circuit 222 can include an n-channel signal transistor M24 connected in series with a diode-connected transistor M26 which operates as a threshold increasing device, as well as a resistance R22. In the embodiment shown, transistor M24 has a source-drain connected between node B and transistor M26, and a gate connected to node A. Diode connected transistor M26 has a source-drain connected between a source of transistor M26 and resistance R22, and a gate connected to its drain. Resistance R22 can be between a source of transistor M26 and low power supply node 218. In such an arrangement, high threshold section 222 can discharge node B toward VSS when a voltage at node A exceeds about 2*Vtn (where transistors M24/M26 both have a threshold voltage Vtn).

An output section 206 can have a p-channel output transistor M28 and n-channel output transistor M21 having a CMOS inverter configuration. However, one or both of transistors M28/M21 can have relatively long channels as compared to other transistors of the POR circuit 200. In some embodiments, transistor M28 can have a longer channel than transistor M22 and any p-channel transistors in drive stage 226 (described in more detail below). In addition or alternatively, transistor M21 can have a longer channel than either of transistors M24/M26 and any n-channel transistors in drive stage 226.

A drive section 208 can include a drive stage 226, which can be an inverter. In particular embodiments, a drive stage 226 can be a CMOS type inverter having a p-channel transistor with a channel length longer than that of M22 and shorter than that of M28, as well as an n-channel transistor having a channel length shorter than that of M21. Drive section 208 can drive node 224 to generate a RESET signal.

POR circuit 200 can operate in the same general fashion as described for FIG. 1, including operating as a BOD circuit.

Figure 3:
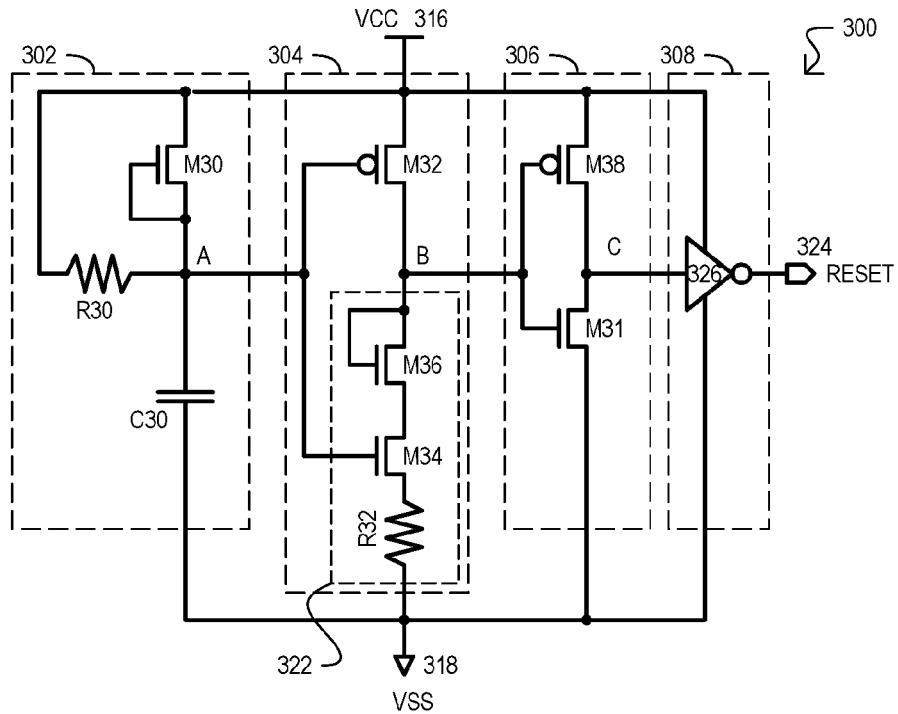
FIG. 3 is a block schematic diagram of a POR circuit according to a further embodiment.

FIG. 3 is a block schematic diagram of a POR circuit 300 according to another embodiment. In one embodiment, a POR circuit 300 can be one particular implementation of that shown in FIG. 1. A POR circuit 300 can have items arranged like those of FIG. 2. FIG. 3 differs from FIG. 2 in that a threshold increasing device M36 can be connected between n-channel signal transistor M34 and node B.

POR circuit 300 can operate in the same general fashion as described for FIG. 1, including operating as a BOD circuit.

Figure 4:
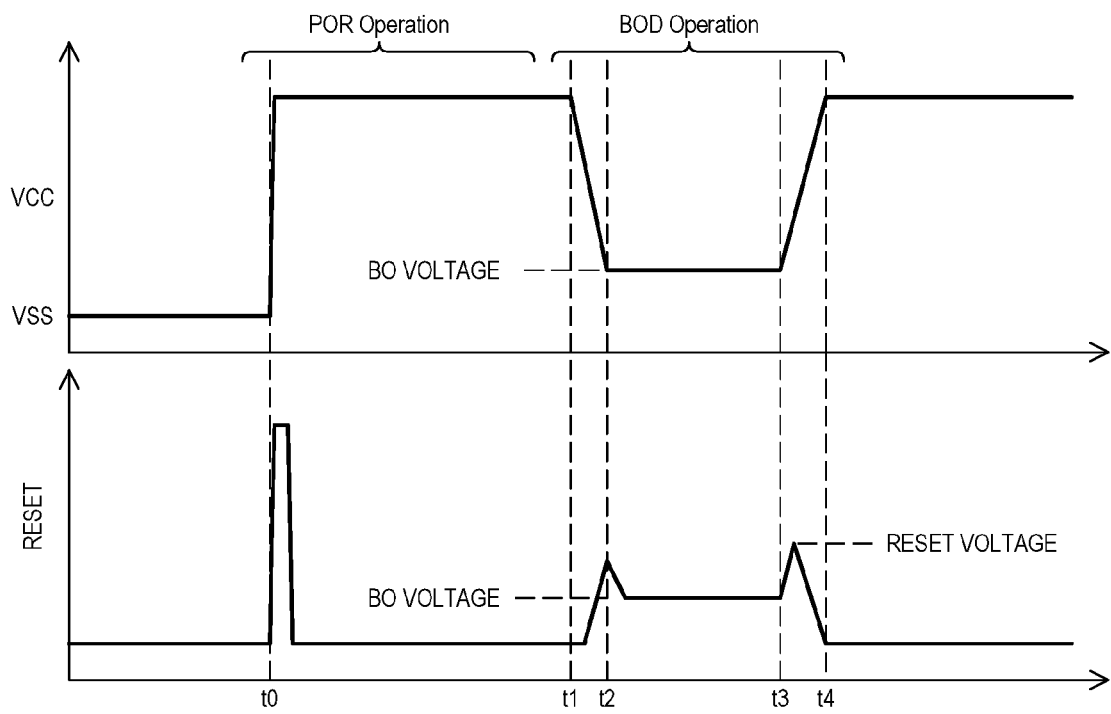
FIG. 4 is a timing diagram showing operations of a POR circuit according to embodiments.

FIG. 4 shows timing diagrams of operations of a POR circuit according to embodiments. FIG. 4 includes a waveform for a high power supply voltage (VCC) as well as a waveform for a RESET signal. FIG. 4 shows a power-on reset type operation, where VCC ramps up from VSS and a brown-out operation, where VCC falls below some predetermined limit.

Referring to FIG. 4, prior to time t0, a device power supply is inactive (e.g., VCC=VSS). Thus, a RESET pulse can be inactive (at VSS in this example).

Figure 9:
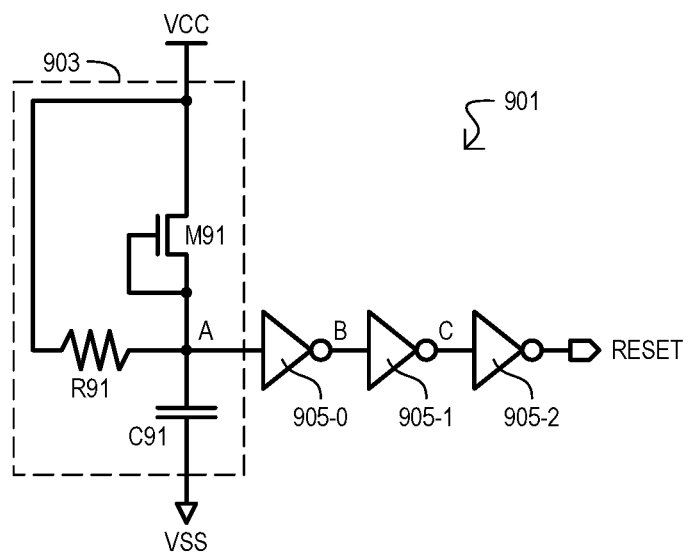
FIG. 9 is a block schematic diagram of a conventional POR circuit.

At about time t0, VCC can ramp up. As VCC ramps up, signal RESET can rise. In some embodiments, such an operation can include a device operating in a sub-threshold mode, as described herein. However, in other embodiments VCC levels can enable various stages of a POR circuit (i.e., like the conventional case of FIG. 9) and generate a RESET signal based on an initial low value at a detect node.

After time t0, a detect node of the POR circuit (e.g., node A) can rise above a high threshold level, causing the signal node to discharge. This results in RESET falling and creating a RESET pulse.

Referring still to FIG. 4, at about time t1, VCC can start to fall. As VCC falls, signal node (e.g., node B) can start to rise. For example, a high threshold discharge path can turn off, and a sub-threshold device can charge the signal node.

At about time t2, VCC can reach a limit (BO VOLTAGE). A signal node (e.g., node B) can be at a sufficiently high voltage to drive a RESET signal high.

At about time t3, VCC can ramp up once again, but at a slower rate. By operation of a device operating in the sub-threshold mode, RESET can also rise. After time t3, a detect node of the POR circuit (e.g., node A) can rise above a high threshold level, causing the signal node to discharge. This results in RESET falling to VSS at time t4.

Figure 5:
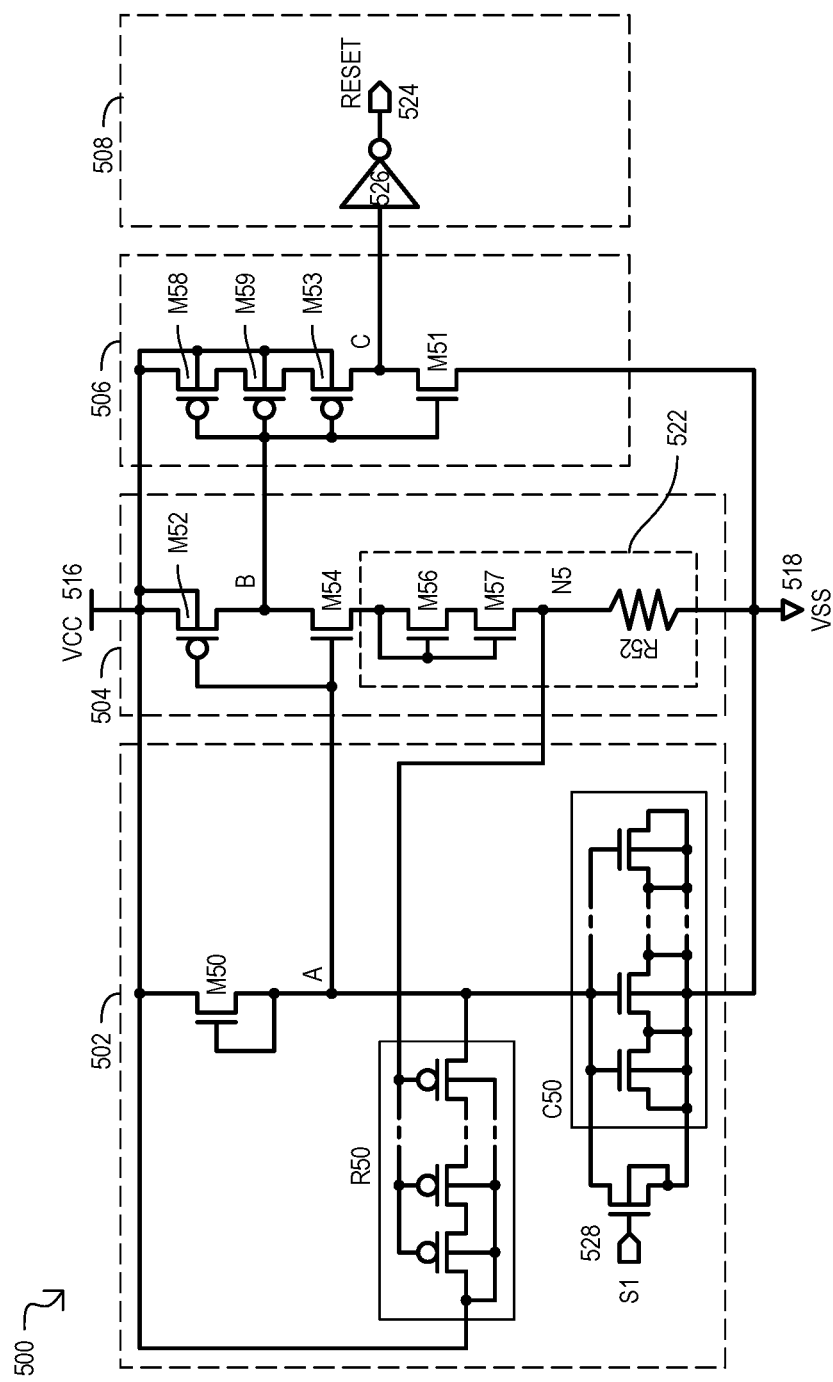
FIG. 5 is a block schematic diagram of a POR circuit according to another embodiment.

FIG. 5 is a block schematic diagram of a POR circuit 500 according to another embodiment. A POR circuit 500 can be one particular implementation of that shown in FIG. 1. A POR circuit 500 can have items arranged like those of FIG. 2, however, FIG. 5 can differ from FIG. 2 in a number of ways.

Within a detect section 502, a resistance R50 can be formed by series connected source-drain paths of multiple transistors (p-channel transistors in this embodiment), having bodies commonly connected to a high power supply node 516 and gates commonly connected to a node N5 between resistance R52 and threshold increase device M57 in signal section 504. A capacitance C50 can be formed by parallel connected gate-source/drains of multiple transistors (n-channel transistors in this embodiment), having gates commonly connected to detect node A and body/source/drains commonly connected to low power supply node 518. In the particular embodiment shown, a switch device 528 can be included which can short a path across the capacitance C50 in response to a signal 51.

Within a signal section 504, a high threshold circuit can include two transistors M56/M57 to increase a threshold voltage. Transistors M56 and M57 can have source-drain paths arranged in series between a source of signal transistor M54 and resistance R52, and gates commonly connected to the source of signal transistor M54.

Within an output section 506, a pull-up section can include three p-channel transistors arranged in series having gates commonly connected to node B, for a long channel effect.

POR circuit 300 can operate in the same general fashion as described for FIG. 1, including operating as a BOD circuit.

Figure 6:
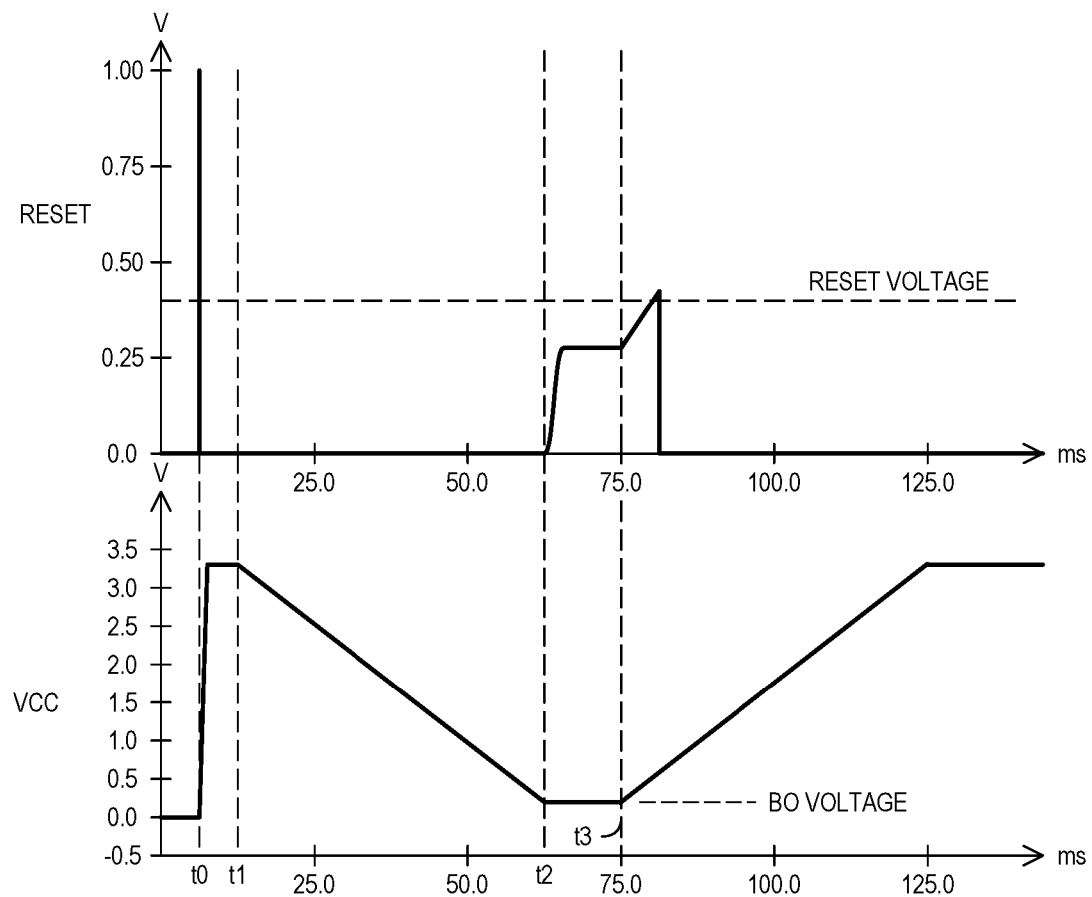
FIG. 6 is a diagram showing operations of a POR circuit like that of FIG. 5.

FIG. 6 is a timing diagram showing operations for a POR circuit 500 like that of FIG. 5. FIG. 6 includes a waveform for a RESET signal and a high power supply voltage (VCC). FIG. 6 shows a power-on reset type operation, where VCC ramps up from 0 volts to 3.3 volts, and a brown-out operation, with a brown out limit of 0.25 volts.

At about time t0, VCC can ramp up, resulting a RESET pulse.

At about time t1, VCC can begin to fall.

At about time t2, VCC can reach a lower brown out level of 0.25 volts. A voltage at node A can fall enough to turn off transistor M54 and/or enable transistor M52, which may be in the subthreshold region, to start to pull node B higher.

At about time t3, VCC can begin to rise again. A voltage at node A can begin to rise, and eventually exceed the threshold established by M54/M56/M57, and node B can be discharged.

It is noted that FIG. 6 is provided by way of example, and voltage levels and timing can vary depending upon process and requirements of downstream circuits.

Figure 7A:
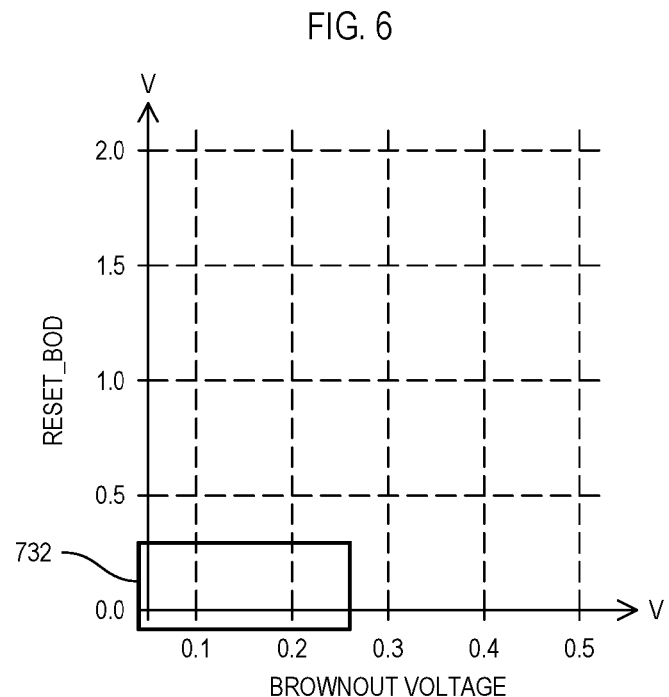
FIGS. 7A and 7B are diagrams showing performance values for a POR circuit like that of FIG. 5.

FIG. 7A is a graph showing a brown out operational range for a circuit like that in FIG. 5. FIG. 7A shows a reset voltage during a brown out operation RESET_BOD versus a brown out voltage. Box 732 shows a region in which a circuit may not properly operate. In particular, if a RESET signal fails to reach 250 mV, it may not be sufficient to drive other circuits in a device (e.g., latches) to establish an operational state of the device.

Figure 7B:
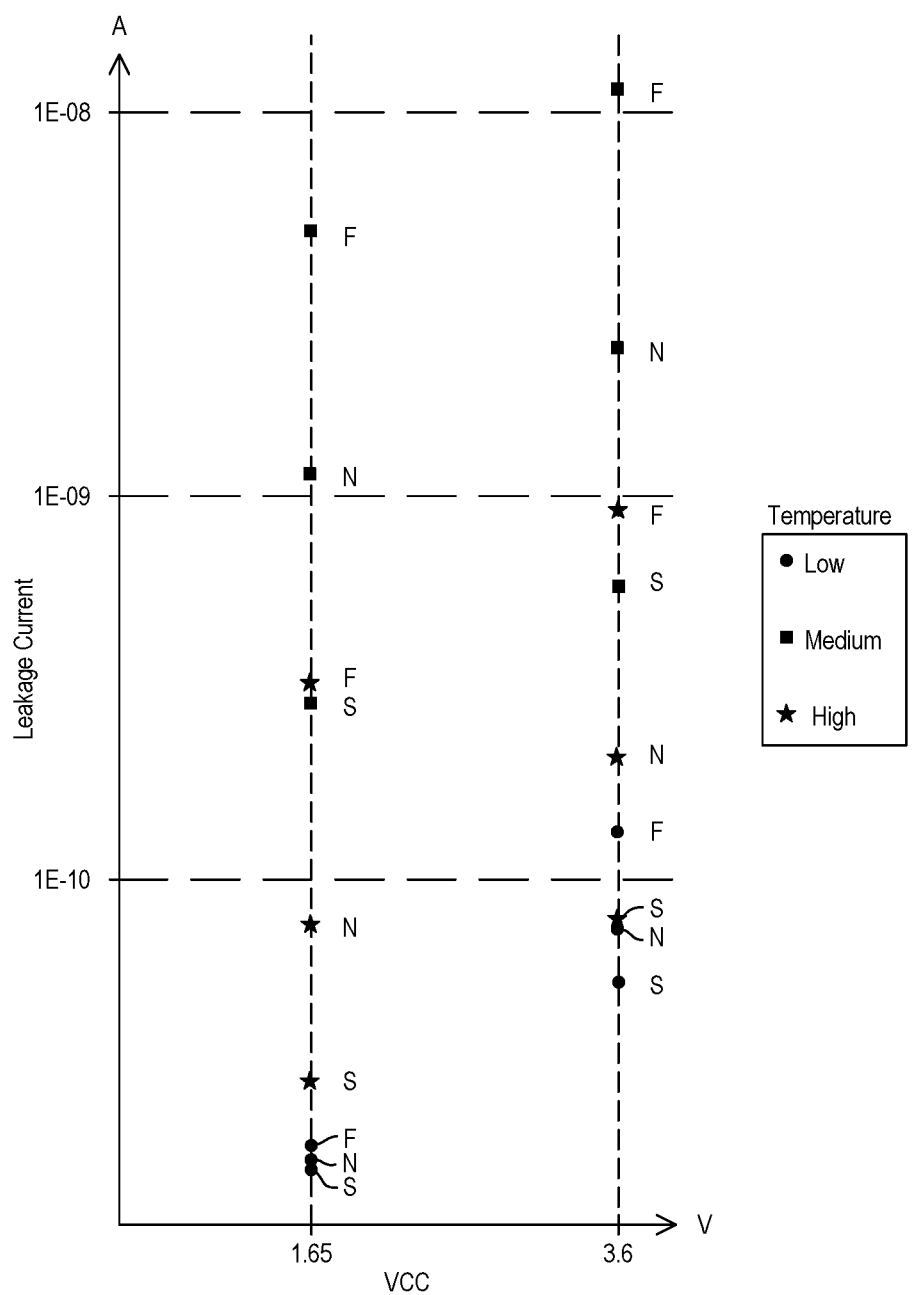

FIG. 7B is a graph showing a leakage current levels for a POR circuit like that of FIG. 5 for process and operational variations. In particular, FIG. 7B shows leakage current at two power supply voltages (1.65 volts, 3.6 volts), three different operating temperatures: low (circle), medium (square), high (star), and three different fabrication process (e.g., transistor) parameters: fast (F), nominal (N), slow (S).

It is understood that FIGS. 7A and 7B are provided by way of example only, and should not be construed as limiting. Alternate embodiments fabricated with different technologies could have different performance values.

Figure 8:
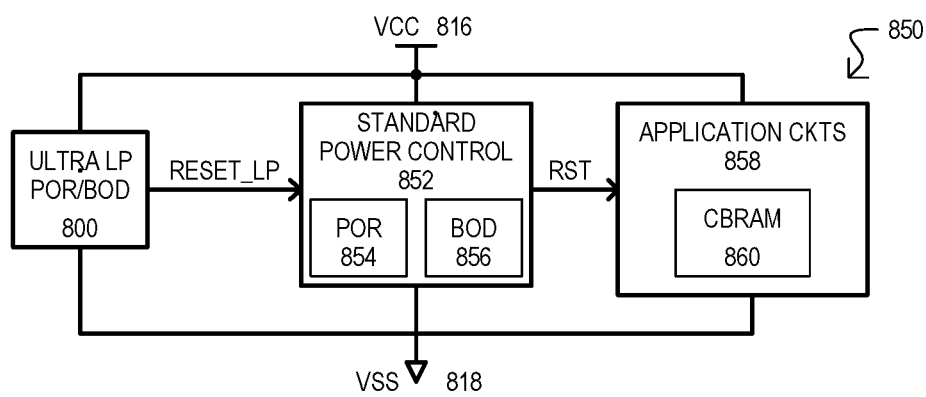
FIG. 8 is a block schematic diagram of a system according to an embodiment.

FIG. 8 is a block schematic diagram of a system 850 according to an embodiment. In some embodiments a system 850 can be an integrated circuit device. A system 850 can include a low power POR/BOD circuit 800, a standard power control circuit 852, and application circuits 858.

A low power POR/BOD circuit 800 can take of the form of any of the POR circuit embodiments described herein or equivalents. Thus, a RESET_LP signal can be generated for various levels of VCC ramping, can have low leakage current levels, and can also serve as a BOD signal.

A standard power control circuit 852 can include one or more other POR circuits 854 and/or BOD circuits 856. Such circuits can generate a reset signal RST in response to POR or BO events. However, standard power control circuits 852 can consume more power than the low power POR/BOD circuit 800, and can be disabled in particular modes (e.g., very low power mode).

Application circuits 858 can perform predetermined functions in response to input values (not shown) and can provide output values (also not shown). Application circuits 858 can utilize a RST signal to ensure power supply voltage levels are sufficient for operations. Application circuits 858 can also be disabled in particular modes (e.g., very low power mode). In the embodiment shown, application circuits can include resistive memory elements 860. Resistive memory elements can be reversibly programmable between first and second resistance states by application of electric fields. In some embodiments, resistive memory elements 860 can be CBRAM type elements. CBRAM elements can provide memory arrays with very low power consumption, and so can be placed in low current consuming modes of operation. Thus a device having CBRAM elements can benefit from low power POR circuits and methods as described herein.

A system 850 can operate in multiple modes, including a low power mode. In a low power mode, standard power control circuit 852 and application circuit can be disabled, and so placed into a low current drawing states. However, low power POR/BOD circuit 800 can remain active, and provide a RESET_LP signal to indicate to the other circuits when power supply voltage levels are (or are not) at sufficient levels.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit, comprising:
   a high power supply node configured to receive a high power supply voltage (VCC) that rises from a low voltage level to a high voltage level in response to predetermined events;
   a supply voltage detect section that includes
      a capacitance coupled between a detect node and a low power supply node, and
      a discharge device coupled between the detect node and the high power supply node, and configured to discharge current from the detect node to the high power supply node;
   a signal section that includes
      a first signal transistor configured to operate in a subthreshold region to maintain a signal node at about VCC as VCC rises from the low voltage level, and
      a high threshold section having at least one second signal transistor, the high threshold section enabling a current path from the signal node to the low power supply node only after a voltage at the detect node exceeds a switch level, the switch level being greater than a threshold voltage (Vt) of the second signal transistor; and
   an output section configured to drive an output node in response to a voltage at the signal node, the output section including
      a first output transistor of a first conductivity type, and
      a second output transistor of a second conductivity type.

2. The circuit of claim 1, wherein the first signal transistor is of the first conductivity type and has a shorter channel than at least the first output transistor.

3. The circuit of claim 1, wherein:
   the second signal transistor is of the second conductivity type; and
   the second output transistor has a channel length greater than that of the second signal transistor.

4. The circuit of claim 1, wherein:
   the high threshold section includes
      the second signal transistor having a source-drain path coupled between the signal node and the low power supply node and a gate coupled to the detect node, and
      at least one threshold increase transistor having a source-drain path coupled in series with that of the second signal transistor, and a gate coupled to the drain of the at least one threshold increase transistor.

5. The circuit of claim 4, wherein the source-drain path of the at least one threshold increase transistor is coupled between the second signal transistor and the low power supply node.

6. The circuit of claim 4, wherein the source-drain path of the at least one threshold increase transistor is coupled between the signal node and the second signal transistor.

7. The circuit of claim 1, further including:
a drive section that includes
  a first drive transistor of the first conductivity type having a source-drain path coupled between a drive node and the high power supply node, and a gate coupled to the output node, and
  a second drive transistor of the second conductivity type having a source-drain path coupled between the drive node and the low power supply node, and a gate coupled to the output node; wherein
the channel of the first output transistor is longer than that of the first drive transistor, and
the channel of the second output transistor is longer than that of the second drive transistor.

8. An integrated circuit (IC) device, comprising:
a high power supply node configured to receive a high power supply voltage (VCC) that rises from a low voltage level to a high voltage level in response to predetermined events; and
a low power (LP) power-on reset circuit that includes
  a supply voltage detect section configured to generate a detect voltage at a detect node that rises in delayed fashion with respect to rises in VCC; and
  a signal section that includes
    a first signal transistor of a first conductivity type having a source-drain path coupled between the high power supply node and a signal node and a gate coupled to the detect node, and
  a high threshold section having
    a second signal transistor of a second conductivity type having a source-drain path coupled between the signal node and a low power supply node, and a gate coupled to the detect node, and
    at least one threshold increase transistor of the second conductivity type having a source-drain path in series with the second signal transistor,
  an output section that includes
    a first output transistor of a first conductivity type having a source-drain path coupled between an output node and the high power supply node, and a gate coupled to the signal node, and
    a second output transistor of a second conductivity type having a source-drain path coupled between the output node and the low power supply node, and a gate coupled to the signal node; wherein
  the first signal transistor has a shorter channel than the first output transistor and the second output transistor has a longer channel than the second signal transistor.

9. The IC device of claim 8, wherein:
the supply voltage detect section includes
  a capacitance coupled between a detect node and a low power supply node,
  a discharge device coupled between the detect node and the high power supply node, and configured to discharge current from the detect node to the high power supply node, and
  a resistance coupled between the detect node and the high power supply node.

10. The IC device of claim 9, wherein the discharge device is selected from the group of a diode connected transistor and a diode.

11. The IC device of claim 9, wherein the capacitance includes at least one transistor having a gate coupled to a first capacitance node and source and drains connected to a second capacitance node.

12. The IC device of claim 9, wherein the resistance includes a plurality of transistors having source-drain paths connected in series with one another between a first resistance node and a second resistance node.

13. The IC device of claim 8, further including:
application circuits coupled to receive power from the high power supply voltage and configured to execute predetermined operations in response to input signals.

14. The IC device of claim 13, wherein the application circuits include at least one array of programmable resistance elements, the programmable resistance elements being reversibly programmable between at least two different impedance states in response to an application of electric fields across the programmable resistance elements.

15. The IC device of claim 8, further including:
the IC device includes a first mode and a second mode, the first mode having lower power consumption than the second mode; and
a standard mode power-on reset circuit configured to generate a standard power-on reset (POR) signal in response to at least power-on events of the IC device in the second mode and to not generate the standard POR signal in the first mode, the standard mode power-on reset circuit being disabled in the first mode; and
the LP power-on reset circuit is enabled in the first mode.

16. A method, comprising:
in response to a high power supply voltage (VCC) rising from a low level to a high level;
  generating a detect voltage on a capacitance at a detect node that rises as VCC rises, but is delayed with respect to rises in VCC, and
  generating a voltage on a signal node that rises as VCC rises by operation of a first signal transistor operating in a subthreshold region,
in response to the voltage at the detect node rising above a signal threshold voltage, discharging the signal node toward a low power supply voltage (VSS) through at least one second signal transistor, the signal threshold level being greater than a threshold voltage (Vt) of the second signal transistor;
in response to the signal node voltage rising as VCC rises, driving an output node toward VSS with an n-channel drive transistor;
in response to the signal node voltage discharging toward VSS, driving the output node toward VCC with a p-channel drive transistor having a longer channel length than the first signal transistor; and
generating a power-on reset (POR) signal from a voltage on the output node.

17. The method of claim 16, wherein the n-channel drive transistor has a longer channel length than the second signal transistor.

18. The method of claim 16, wherein the signal threshold level is no less than two Vt.

19. The method of claim 16, further including:
in response to the high power supply voltage (VCC) falling from the high level toward the low level;
  discharging the voltage on the signal node,
  in response to the voltage at the detect node falling below the signal threshold voltage, turning off the second signal transistor,
  generating a voltage on the signal node by operation of the first signal transistor operating in the subthreshold region,
  generating a brown out detection (BOD) signal from the voltage on the signal node.

20. The method of claim 16, wherein:
the POR signal is generated in a first mode of operation with a low power POR circuit; and
generating a second POR signal in a second mode of operation with a second POR circuit, and not generating the second POR in the first mode; wherein
the first mode is a lower power consumption mode than the second mode.

\* \* \* \* \*